US012684714B2

(12) United States Patent
Park et al.

(10) Patent No.: US 12,684,714 B2
(45) Date of Patent: Jul. 14, 2026

(54) DISPLAY DEVICE

(71) Applicant: KORTEK CORPORATION, Incheon (KR)

(72) Inventors: Young Il Park, Incheon (KR); Woo Hwangbo, Yongin-si (KR); Ji Woong Park, Jeonju-si (KR); Kyoung Un Bae, Chilgok-gun (KR)

(73) Assignee: KORTEK CORPORATION, Incheon (KR)

( * ) Notice: Subject to any disclaimer, the term of this patent is extended or adjusted under 35 U.S.C. 154(b) by 270 days.

(21) Appl. No.: 18/576,500

(22) PCT Filed: Jul. 1, 2022

(86) PCT No.: PCT/KR2022/009497
§ 371 (c)(1),
(2) Date: Jan. 4, 2024

(87) PCT Pub. No.: WO2023/282547
PCT Pub. Date: Jan. 12, 2023

(65) Prior Publication Data
US 2024/0314949 A1 Sep. 19, 2024

(30) Foreign Application Priority Data
Jul. 8, 2021 (KR) ........................ 10-2021-0089810

(51) Int. Cl.
*H05K 5/02* (2006.01)
*H05K 7/20* (2006.01)

(52) U.S. Cl.
CPC ....... *H05K 5/0217* (2013.01); *H05K 7/20963* (2013.01)

(58) Field of Classification Search
CPC ........................ H05K 5/0217; H05K 7/20963
See application file for complete search history.

(56) References Cited

U.S. PATENT DOCUMENTS

2014/0028931 A1 1/2014 Tsurusaki et al.
2020/0333654 A1 10/2020 Katagiri et al.

FOREIGN PATENT DOCUMENTS

| JP | 2007-108386 A | 4/2007 | | |
| JP | 2015-148640 A | 8/2015 | | |
| KR | 10-2009-0122054 A | 10/2013 | | |
| KR | 10-2015-0077156 A | 7/2015 | | |
| KR | 10-2016-0142904 A | 12/2016 | | |
| KR | 10-2017-0064249 A | 6/2017 | | |
| KR | 20180038117 A * | 4/2018 | ............. | H05K 1/147 |
| KR | 10-2018-0038117 A | 9/2018 | | |
| KR | 2020-0082379 A | 7/2020 | | |

(Continued)

OTHER PUBLICATIONS

WO 2013179822 A1 English translation (Year: 2013).*

(Continued)

*Primary Examiner* — Mukundbhai G Patel
(74) *Attorney, Agent, or Firm* — Schmeiser Olsen PLLC

(57) ABSTRACT

A display device is provided including a cover bottom part, a display panel installed on the cover bottom part, a driving circuit board disposed on one side of the display panel, and at least one flexible substrate bonded to the display panel and the driving circuit board to be bent toward an inner side of the driving circuit board.

12 Claims, 6 Drawing Sheets

(56)         References Cited

FOREIGN PATENT DOCUMENTS

| | | | |
|---|---|---|---|
| KR | 10-2016-0082556 A | 6/2021 | |
| KR | 10-2021-0054118 A | 11/2023 | |
| WO | WO-2013179822 A1 * | 12/2013 | ....... G02F 1/133308 |

OTHER PUBLICATIONS

KR 20180038117 A. English translation (Year: 2018).*
International Search Report for PCT /KR2022/009497, mailed on
Oct. 14, 2022.

* cited by examiner

DISPLAY DEVICE

CROSS-REFERENCE TO RELATED APPLICATIONS

This application claims priority to PCT Application No. PCT/KR2022/009497, having a filing date of Jul. 1, 2022, claiming priority to KR Application No. 10-2021-0089810, having a filing date of Jul. 8, 2021, the entire both contents of which are hereby incorporated by reference.

FIELD OF TECHNOLOGY

The following relates to a display device, and more specifically, to a display device capable of preventing a flexible substrate or display drive element from being damaged by stress and reducing a width of a bezel region.

BACKGROUND

In general, in a curved display device, a display panel is seated on a curved device (curved back light unit (BLU)), and a driving circuit unit is fixed to the curved device. A cover is installed to shield the display panel from the outside, and the cover is made of a metal or tape material. The display panel and the driving circuit unit are electrically connected by a thin film-shaped flexible substrate. The driving circuit unit is installed in a full folding method in which the driving circuit unit is completely folded to a rear surface of the curved device, or a half folding method in which the driving circuit unit is fixed perpendicularly to a side of the curved device.

However, in the related art, since stress concentration occurs in the flexible substrate due to the curvature of the display device, the flexible substrate may be torn or bonding may be broken. Further, as stress is applied to the display drive element mounted on the flexible substrate, the display drive element may be damaged.

In addition, since the flexible substrate is disposed on a rear surface or side surface of the curved device, there is a limit to reducing the curvature of the display panel.

The conventional technology is disclosed in Korea Patent Publication No. 2021-0054118 (published on May 13, 2021, title of invention: Curved Display Device).

SUMMARY

An aspect relates to a display device capable of preventing a flexible substrate or display drive element from being damaged by stress and reducing a width of a bezel region.

One aspect of embodiments of the present invention provide a display device including a cover bottom part, a display panel installed on the cover bottom part, a driving circuit board disposed on one side of the display panel, and at least one flexible substrate bonded to the display panel and the driving circuit board to be bent toward an inner side of the driving circuit board.

The display panel may be a curved display panel.

The display panel and the driving circuit board may be disposed on the same curved surface.

The display panel and the driving circuit board may be formed with the same curvature.

A bent portion of the flexible substrate may be disposed between the driving circuit board and the display panel.

The bent portion of the flexible substrate may be bent toward an outside of the driving circuit board.

Both sides of the flexible substrate may be bonded to surfaces of the display panel and the driving circuit board on a side closer to the cover bottom part.

Both sides of the flexible substrate may be bonded to surfaces of the display panel and the driving circuit board on a side opposite to the cover bottom part.

The display device may further include a panel guide part in which an accommodating chamber is formed so that a bent portion of the flexible substrate is accommodated inside the driving circuit board.

At least one heat dissipation hole may be formed in the panel guide part to dissipate heat from the accommodating chamber.

A communication hole may be formed in the cover bottom part to communicate with the heat dissipation hole.

The panel guide part may further include a heat dissipation pad installed to cover the heat dissipation hole.

A support portion may be formed on the panel guide part to support the display panel and the driving circuit board.

According to embodiments of the present invention, since almost no tension or stress is applied to a flexible substrate as the flexible substrate is installed to be bent, it is possible to prevent the flexible substrate from being torn or prevent a bonding portion of the flexible substrate or a display drive element from being damaged by stress.

In addition, according to embodiments of the present invention, since the flexible substrate is connected to the display panel and the driving circuit board in a bent state, it is possible to significantly reduce a gap between the display panel and the driving circuit board. Accordingly, it is possible to significantly reduce the width of a bezel region, and it is possible to relatively increase the size of the display panel in a display device having the same size.

In addition, according to embodiments of the present invention, as stress applied to the flexible substrate is reduced when a display device is assembled, it is possible to minimize damage to the flexible substrate and to obtain high process yield.

BRIEF DESCRIPTION

Some of the embodiments will be described in detail, with references to the following Figures, wherein like designations denote like members, wherein.

DETAILED DESCRIPTION

Figure 1:
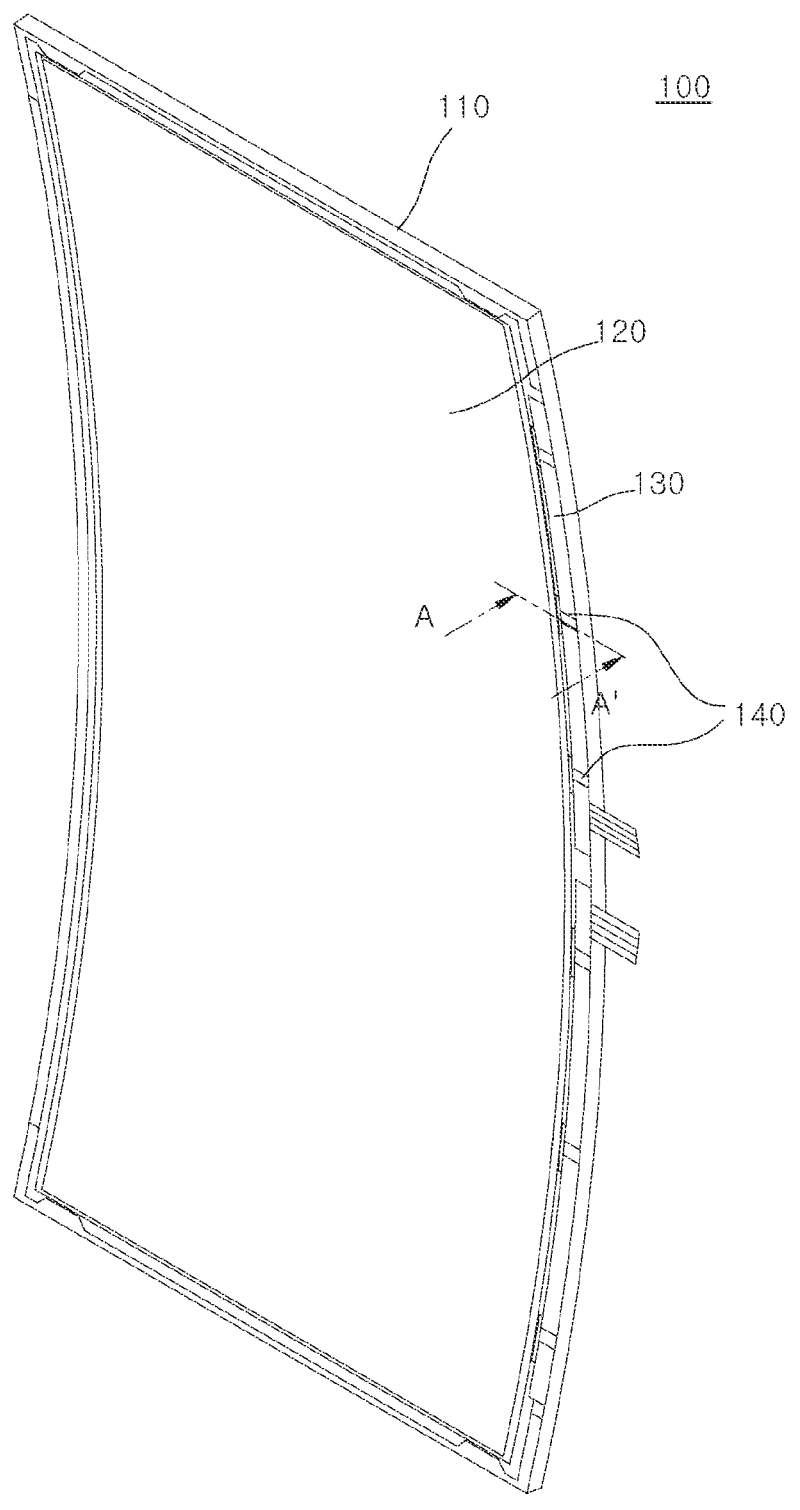
FIG. 1 is a perspective view illustrating a display device according to a first embodiment of the present invention.

Hereinafter, embodiments of a display device according to the present invention will be described with reference to the accompanying drawings. In the process of describing the display device, thicknesses of lines, dimensions of elements, and the like shown in the drawings may be exaggerated for clarity and convenience. Also, terms described below may be defined in consideration of functions in embodiments of the present invention and may be changed depending on the customary practice or the intention of a user or operator. Thus, definitions of such terms should be determined based on the overall content of the present specification.

First, a display device according to a first embodiment of the present invention will be described.

Figure 2:
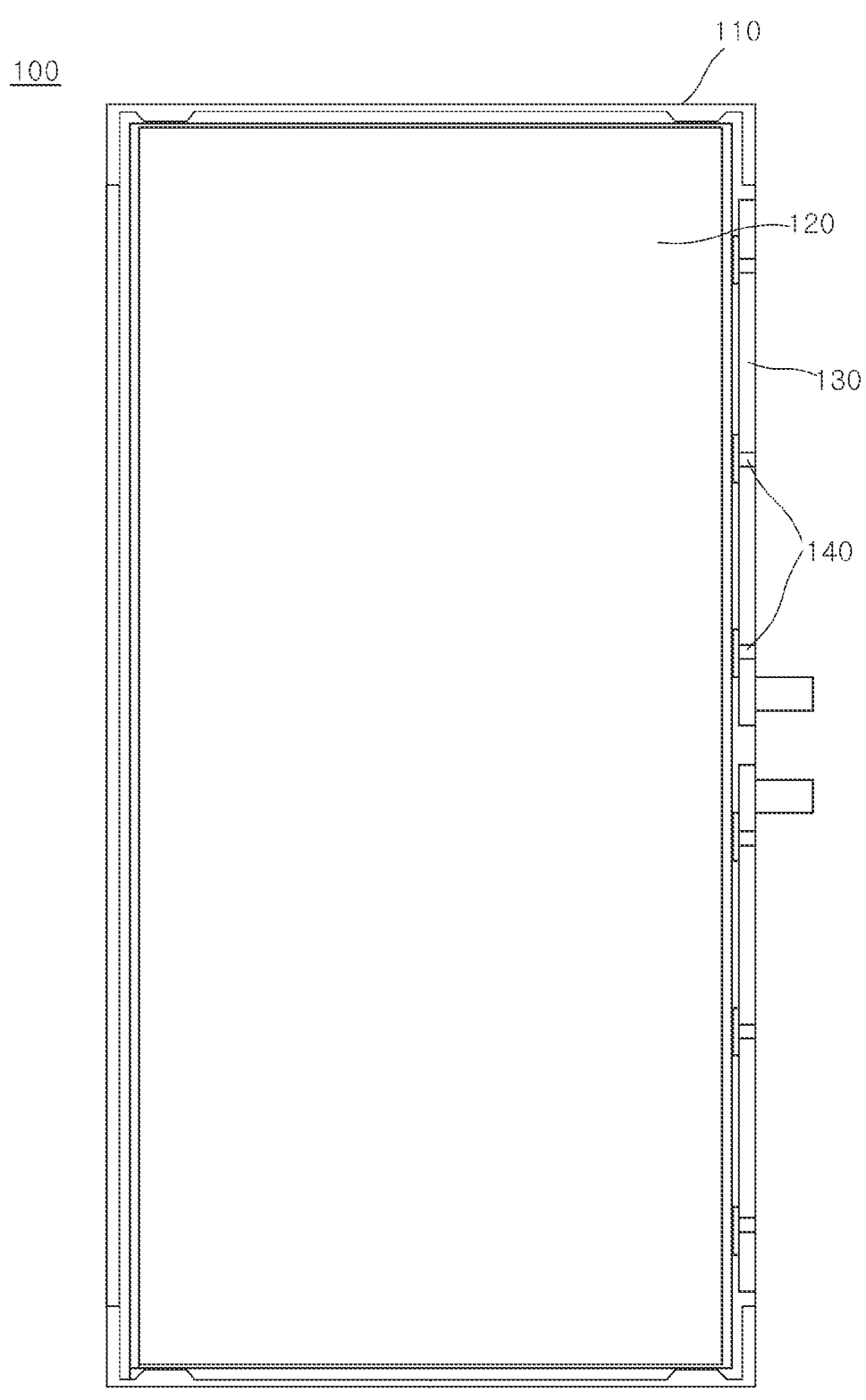
FIG. 2 is a plan view illustrating the display device according to the first embodiment of the present invention.
Figure 3:
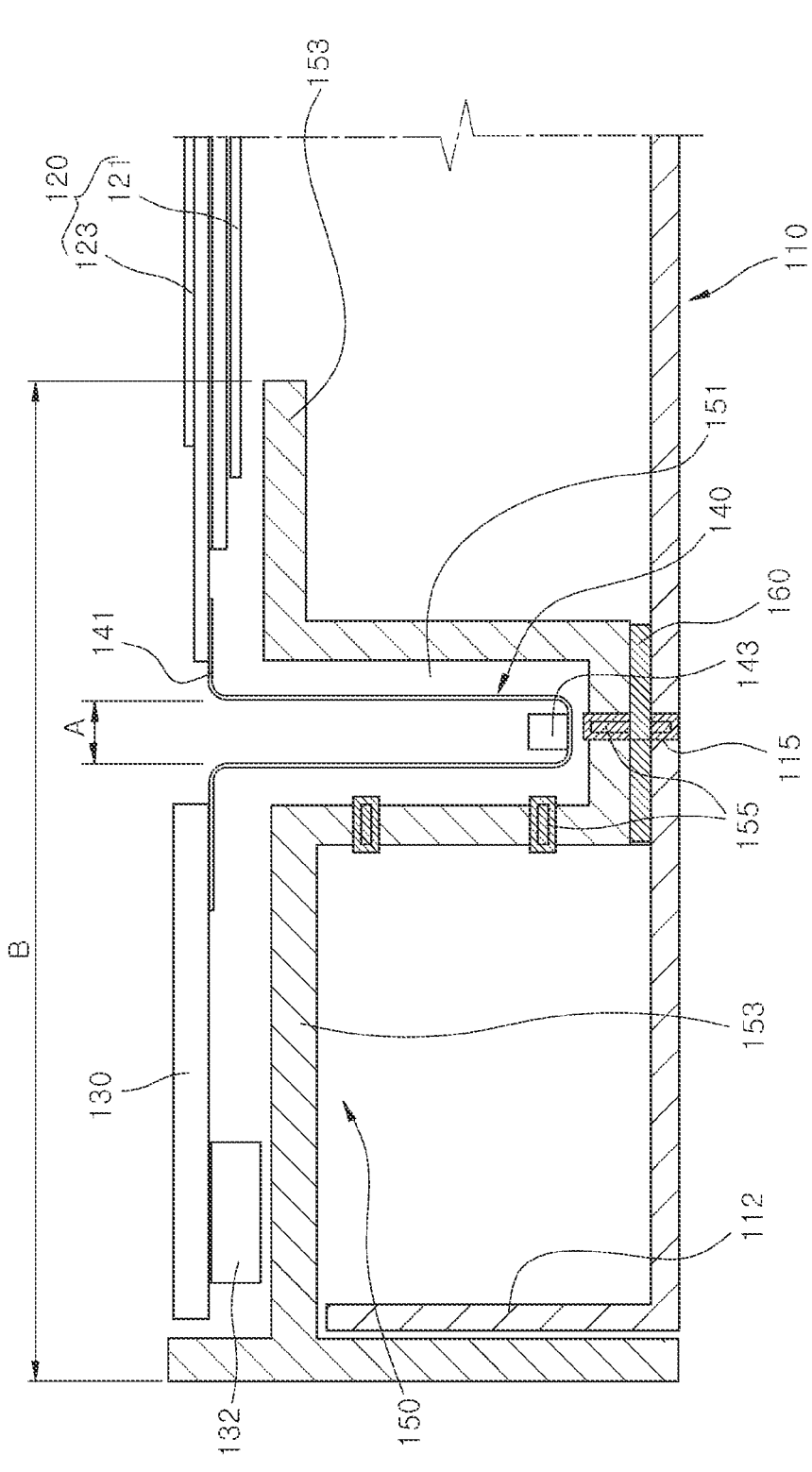
FIG. 3 is a cross-sectional view illustrating the display device according to the first embodiment of the present invention.

FIG. 1 is a perspective view illustrating a display device according to a first embodiment of the present invention, FIG. 2 is a plan view illustrating the display device according to the first embodiment of the present invention, and FIG. 3 is a cross-sectional view illustrating the display device according to the first embodiment of the present invention.

Referring to FIGS. 1 to 3, a display device 100 according to the first embodiment of the present invention includes a cover bottom part 110, a display panel 120, a driving circuit board 130, and flexible substrates 140.

The cover bottom part 110 is installed to cover a rear side of the display device 100. On a peripheral portion of the cover bottom part 110, an edge portion 112 is formed to be curved toward the front. The cover bottom part 110 may be made of plastic material.

The display panel 120 is installed on the cover bottom part 110. In this case, the display panel 120 is disposed on a front side of the display device 100. The display panel 120 is made by stacking a color filter panel portion 123 and a thin film transistor portion 121. An upper polarizer is attached to an upper surface of the color filter panel portion 123, and a lower polarizer is attached to a lower surface of the thin film transistor portion 121.

The driving circuit board 130 is disposed on one side of the display panel 120. The driving circuit board 130 is disposed on the same or almost the same plane as the display panel 120. The driving circuit board 130 is disposed to be spaced apart from the display panel 120 at a certain interval. At least one driving circuit board 130 is disposed on an upper side of the display panel 120 in the form of a long, thin band. The number of driving circuit boards 130 may vary depending on a size of the display panel 120. The driving circuit board 130 supplies electric power to the display panel 120. A semiconductor device such as a drive controller 132 is mounted on the driving circuit board 130.

At least one flexible substrate 140 is bonded to the display panel 120 and the driving circuit board 130 so that the flexible substrate is bent toward an inner side of the driving circuit board 130 to be hung. The flexible substrates 140 are arranged in a longitudinal direction of the driving circuit board 130. The flexible substrates 140 are formed by patterning copper wires on a thin cover layer film. A display drive element 143 (display drive IC) is mounted on each of the flexible substrates 140. Since the flexible substrate 140 is bonded in a form of being bent toward the inner side of the driving circuit board 130 to be hung, the flexible substrate 140 is installed in a loosely sagging state.

Therefore, since almost no tension or stress is applied to the flexible substrate 140 as the flexible substrate 140 is installed to be bent, it is possible to prevent the flexible substrate 140 from being torn or a bonding portion of the flexible substrate 140 or a display drive element 143 from being damaged by stress. In addition, since the flexible substrate 140 is installed in the bent state to be hung on the display panel 120 and the driving circuit board 130, it is possible to significantly reduce a gap between the display panel 120 and the driving circuit board 130. As a result, it is possible to significantly reduce the width of a bezel region B disposed around the display panel 120, and it is possible to relatively increase the size of the display panel 120 in the display device 100 having the same size. In addition, as the bezel region B is reduced, it is possible to implement the design of the display device 100 in more diverse ways.

A curved display panel 120 is applied as the display panel 120. The curved display panel 120 may be curved to form a curved surface in a long-side direction of the display device 100 and may be formed to be straight in a short-side direction thereof. In this case, the driving circuit board 130 is disposed on the same curved surface as the curved display panel 120 and is formed with the same curvature as the curved display panel 120.

Therefore, since both sides 141 of the flexible substrate 140 are bonded to the curved display panel 120 and the driving circuit board 130 with the same curvature, almost no stress or tension is applied to the flexible substrate 140. In addition, since the driving circuit board 130 and the curved display panel 120 are formed with the same curvature, the curvature of the display panel 120 may be implemented to be smaller, and the tension or stress applied to the flexible substrate 140 may be minimized. In addition, as the stress applied to the flexible substrate 140 is reduced when the display device 100 is assembled by seating the display panel 120 on a curved device (curved BLU) and then positioning and fixing the driving circuit board 130 on the same spherical surface as the display panel 120 when the display device 100 is assembled, damage to the flexible substrate 140 may be minimized, and high process yield may be obtained.

A bent portion of the flexible substrate 140 is disposed between the driving circuit board 130 and the display panel 120. For example, the bent portion of the flexible substrate 140 is formed approximately in a shape of "U" as a whole. A width of the bent portion is indicated by A. Of course, a bent shape of the flexible substrate 140 may be slightly deformed due to ductility or elasticity of the flexible substrate 140.

Both sides 141 of the flexible substrate 140 are bonded to surfaces (lower surfaces) of the display panel 120 and the driving circuit board 130 on a side closer to the cover bottom part 110. In this case, an end of the color filter panel portion 123 on a side closer to the driving circuit board 130 extends longer toward the driving circuit board 130 than the thin film transistor portion 121 does, and one side of the flexible substrate 140 is bonded to a lower surface of an extended portion of the color filter panel portion 123. The display drive element 143 is mounted on an inner surface of the flexible substrate 140. Therefore, since the flexible substrate 140) shields the display drive element 143 from the outside, the display drive element 143 may be protected by the flexible substrate 140.

In addition, the drive controller 132 is mounted on one surface of the driving circuit board 130 on the side closer to the cover bottom part 110. Therefore, since the drive controller 132 is shielded by the driving circuit board 130, it is possible to more safely protect the drive controller 132.

The display device 100 further includes a panel guide part 150 in which an accommodating chamber 151 is formed so that a bent portion of the flexible substrate 140 is accommodated inside the driving circuit board 130. The panel guide part 150 is supported by the cover bottom part 110. The accommodating chamber 151 may be formed approximately in a shape of "U." Since the panel guide part 150 accommodates the bent portion of the flexible substrate 140, the flexible substrate 140 may be more safely protected, and the accommodating chamber 151 performs even the existing cover function. In addition, a movement range (shaking range) of the bent portion of the flexible substrate 140 may be limited to a certain range by the accommodating chamber 151.

Support portions 153 are formed on the panel guide part 150 to support the display panel 120 and the driving circuit board 130. The support portions 153 are formed on both sides of the accommodating chamber 151. Since the support portions 153 support the display panel 120 and the driving circuit board 130, it is possible to prevent the display panel 120 and the driving circuit board 130 from shaking and improve assembly efficiency.

At least one heat dissipation hole 155 is formed in the panel guide part 150 to dissipate heat from the accommodating chamber 151. The heat dissipation hole 155 may be formed on both sides and a rear side of the accommodating chamber 151. The heat dissipation hole 155 may be formed in an appropriate size so that minimum external foreign substances may be introduced and heat dissipation efficiency may be improved. The number of heat dissipation holes 155 may be appropriately changed in consideration of the size of the display device 100 or required heat dissipation efficiency. Therefore, since heat generated from the display drive element 143 and the flexible substrate 140 is emitted through the heat dissipation hole 155, it is possible to prevent the display drive element 143 or the flexible substrate 140 from overheating.

Communication holes 115 are formed in the cover bottom part 110 to communicate with the heat dissipation holes 155. The communication holes 115 may also be formed in a portion of the cover bottom part 110 that does not correspond to the heat dissipation holes 155. The communication holes 115 may be formed in an appropriate size in consideration of the heat dissipation efficiency of the heat dissipation holes 155. Therefore, heat generated from the display drive element 143 and the flexible substrate 140 may be discharged to the outside of the cover bottom part 110 through the heat dissipation holes 155 and the communication holes 115. Of course, the communication holes 115 may not be formed in the cover bottom part 110 and the cover bottom part 110 may be blocked.

The panel guide part 150 may further include a heat dissipation pad 160 installed to cover the heat dissipation holes 155. The heat dissipation pad 160 allows the heat to be discharged through the heat dissipation holes 155 and the communication holes 115 and prevents external foreign substances such as dust or moisture from penetrating the inside of the cover bottom part 110.

A display device according to a second embodiment of the present invention will be described. Since the second embodiment is substantially the same as the first embodiment except for the driving circuit board 130 and the flexible substrate 140, the same reference numerals will be assigned to the same components as the first embodiment, and description thereof will not be repeated.

Figure 4:
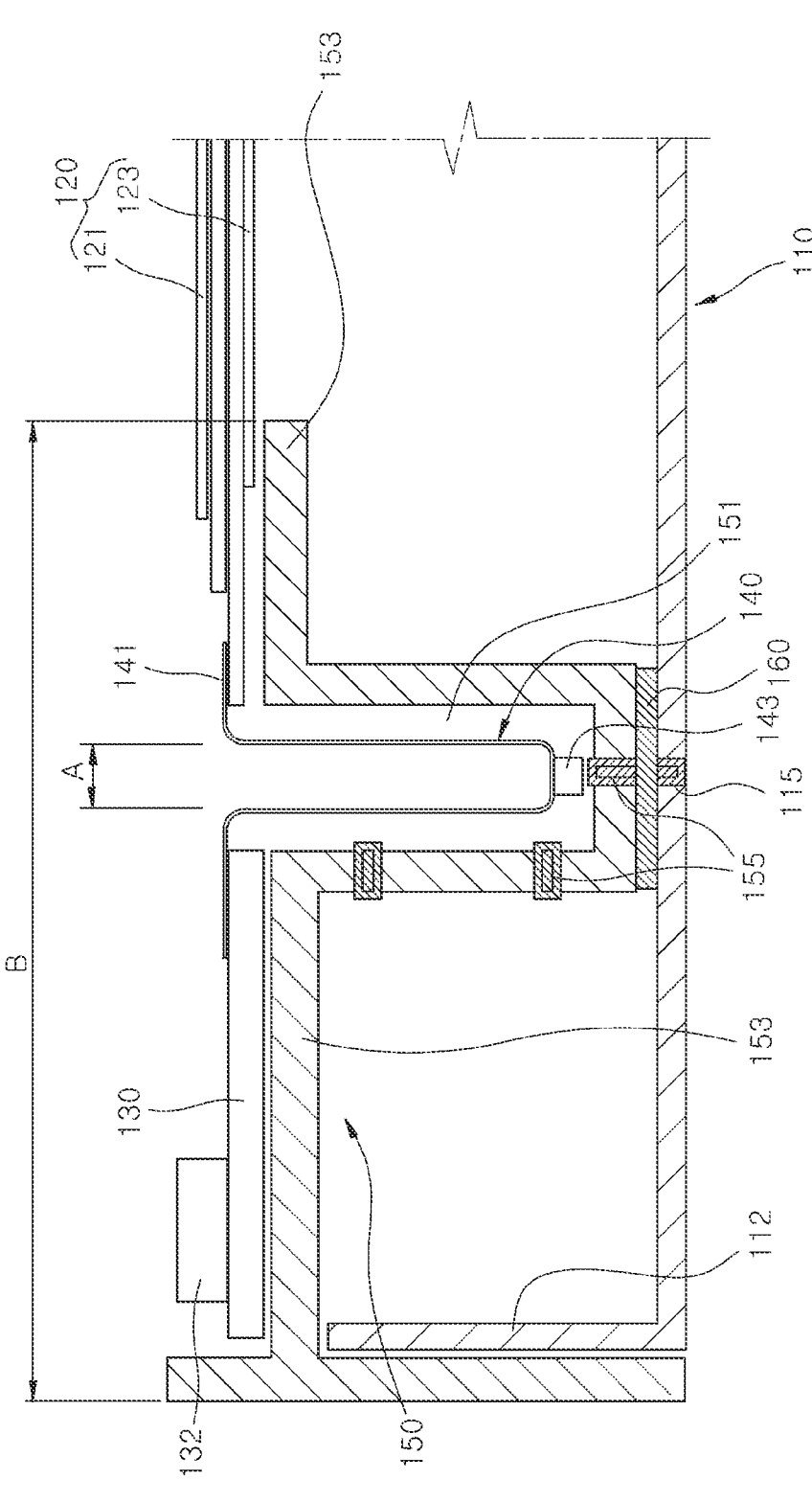
FIG. 4 is a cross-sectional view illustrating a display device according to a second embodiment of the present invention.

FIG. 4 is a cross-sectional view illustrating a display device according to the second embodiment of the present invention.

Referring to FIG. 4, in a display device 100 according to the second embodiment of the present invention, a bent portion of a flexible substrate 140 is disposed between a driving circuit board 130 and a display panel 120. The bent portion of the flexible substrate 140 is formed approximately in a shape of "U."

Both sides 141 of the flexible substrate 140 are bonded to surfaces of the display panel 120 and the driving circuit board 130 on a side opposite to a cover bottom part 110. In this case, an end of a color filter panel portion 123 on a side closer to the driving circuit board 130 extends longer toward the driving circuit board 130 than a thin film transistor portion 121 does, and one side of the flexible substrate 140 is bonded to an upper surface of an extended portion of the color filter panel portion 123. A display drive element 143 is mounted on an outer surface of the flexible substrate 140. Therefore, the flexible substrate 140 may be shielded from the outside by the display panel 120 and the driving circuit board 130, and heat of the display drive element 143 may be more quickly dissipated by the heat dissipation holes 155.

Communication holes 115 may be formed in the cover bottom part 110 to communicate with the heat dissipation holes 155. The communication holes 115 may also be formed in a portion of the cover bottom part 110 that does not correspond to the heat dissipation holes 155. Of course, the communication holes 115 may not be formed in the cover bottom part 110 and the cover bottom part 110 may be blocked.

A panel guide part 150 may further include a heat dissipation pad 160 installed to cover the heat dissipation holes 155. The heat dissipation pad 160 allows the heat to be discharged through the heat dissipation holes 155 and the communication holes 115 and prevents external foreign substances such as dust or moisture from penetrating the inside of the cover bottom part 110.

In addition, a drive controller 132 is mounted on one surface of the driving circuit board 130 on a side opposite to the cover bottom part 110. In this case, the driving circuit board 130 is supported on a support portion 153 of the panel guide part 150. Therefore, the driving circuit board 130 may be stably supported by the support portion 153.

A display device according to a third embodiment of the present invention will be described. Since the third embodiment is substantially the same as the first embodiment except for the driving circuit board 130, the flexible substrate 140, and the panel guide part 150, the same reference numerals will be assigned to the same components as the first embodiment, and description thereof will not be repeated.

Figure 5:
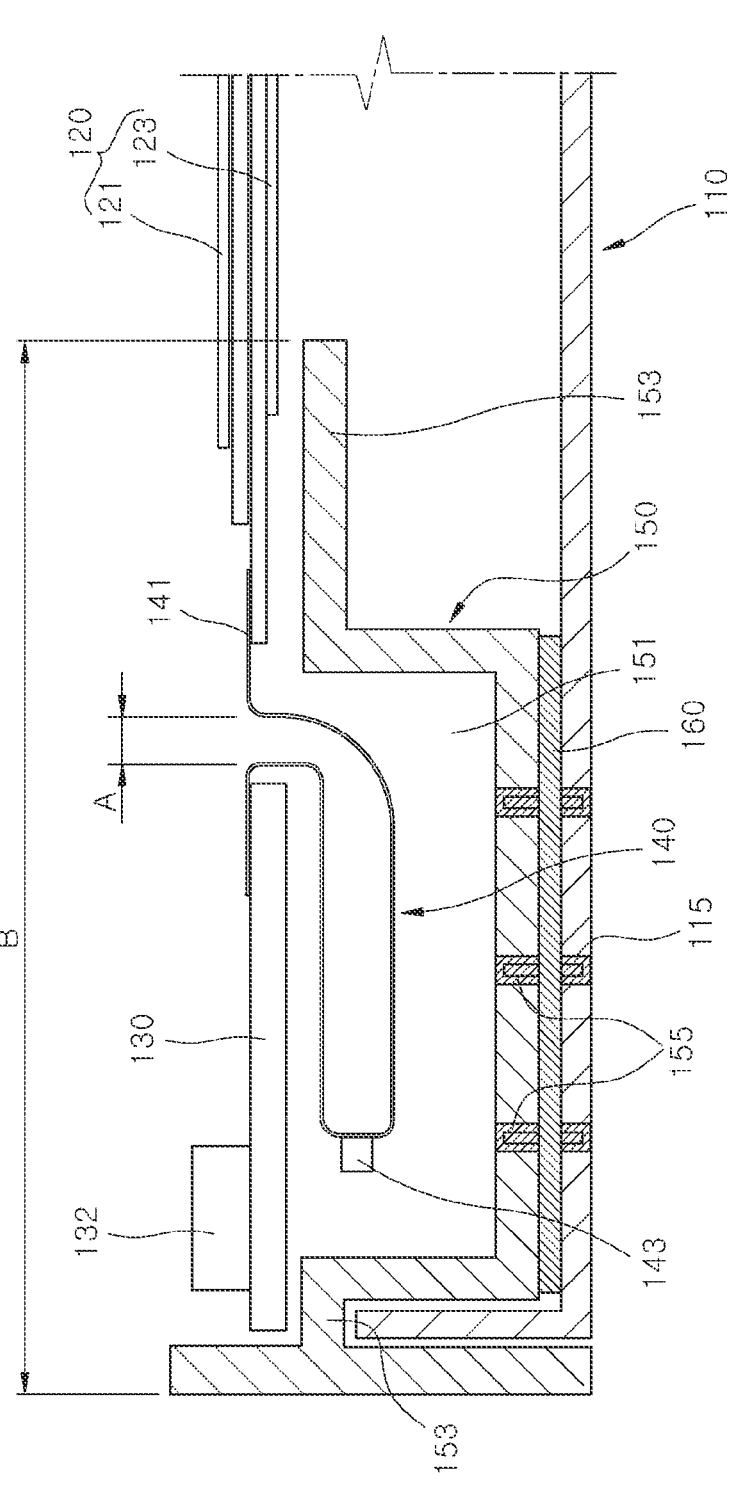
FIG. 5 is a cross-sectional view illustrating a display device according to a third embodiment of the present invention.

FIG. 5 is a cross-sectional view illustrating a display device according to the third embodiment of the present invention.

Referring to FIG. 5, in a display device 100 according to the third embodiment of the present invention, a bent portion of a flexible substrate 140 is bent toward the outside of a driving circuit board 130. The bent portion of the flexible substrate 140 is formed approximately in a shape of "C." and is disposed to be parallel with or inclined to the driving circuit board 130.

Both sides 141 of the flexible substrate 140 are bonded to surfaces of the display panel 120 and the driving circuit board 130 on a side opposite to a cover bottom part 110. In this case, an end of a color filter panel portion 123 on a side closer to the driving circuit board 130 extends longer toward the driving circuit board 130 than a thin film transistor portion 121 does, and one side of the flexible substrate 140 is bonded to an upper surface of an extended portion of the color filter panel portion 123. A display drive element 143 is mounted on an outer surface of the flexible substrate 140.

Communication holes 115 may be formed in the cover bottom part 110 to communicate with the heat dissipation holes 155. The communication holes 115 may also be formed in a portion of the cover bottom part 110 that does not correspond to the heat dissipation holes 155. Of course, the communication holes 115 may not be formed in the cover bottom part 110 and the cover bottom part 110 may be blocked. Therefore, the flexible substrate 140 may be shielded from the outside by the driving circuit board 130, and heat of the display drive element 143 may be more quickly dissipated by the heat dissipation holes 155 or the heat dissipation holes 155 and the communication holes 115.

A panel guide part 150 may further include a heat dissipation pad 160 installed to cover the heat dissipation holes 155. The heat dissipation pad 160 allows the heat to be discharged through the heat dissipation holes 155 and the communication holes 115 and prevents external foreign substances such as dust or moisture from penetrating the inside of the cover bottom part 110.

In addition, a drive controller 132 is mounted on one surface of the driving circuit board 130 on a side opposite to the cover bottom part 110. In this case, the driving circuit board 130 is supported on a support portion 153 of the panel guide part 150. Therefore, the driving circuit board 130 may be stably supported by the support portion 153.

In addition, an accommodating chamber 151 of the panel guide part 150 is formed to be wider than the width of the accommodating chamber 151 of the first embodiment to accommodate the flexible substrate 140 that is horizontal or bent to be slightly inclined. In this case, the side and bottom surfaces of the accommodating chamber 151 are supported by the cover bottom part 110. In addition, the support portion 153 supporting the display panel 120 may be formed to be longer than the support portion 153 supporting the driving circuit board 130.

A display device according to a fourth embodiment of the present invention will be described. Since the fourth embodiment is substantially the same as the first embodiment except for the driving circuit board 130, the flexible substrate 140, and the panel guide part 150, the same reference numerals will be assigned to the same components as the first embodiment, and description thereof will not be repeated.

Figure 6:
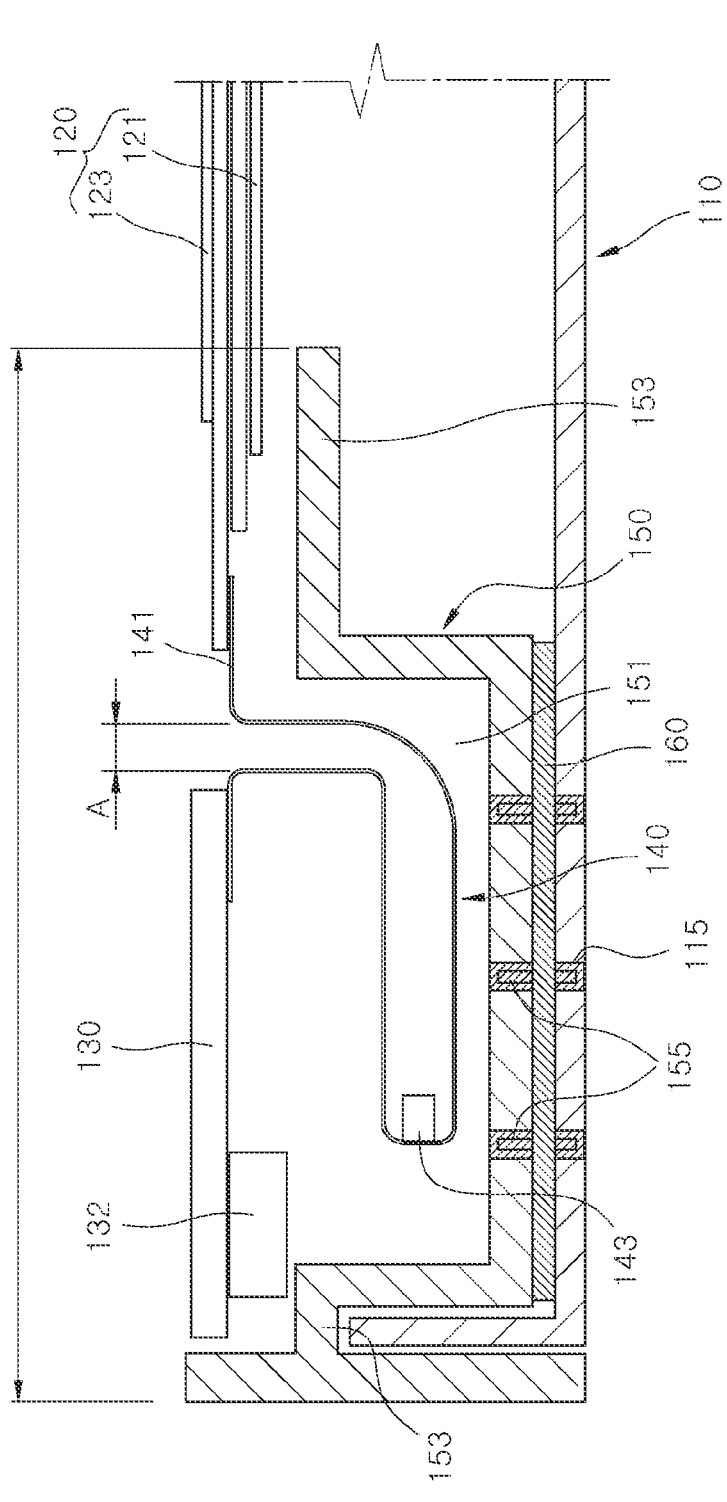
FIG. 6 is a cross-sectional view illustrating a display device according to a fourth embodiment of the present invention.

FIG. 6 is a cross-sectional view illustrating a display device according to the fourth embodiment of the present invention.

Referring to FIG. 6, in a display device 100 according to the fourth embodiment of the present invention, a bent portion of a flexible substrate 140 is bent toward the outside of a driving circuit board 130. The bent portion of the flexible substrate 140 is formed approximately in a shape of "C," and is disposed to be parallel with or inclined to the driving circuit board 130. In addition, the bent portion of the flexible substrate 140 is positioned closer to a cover bottom part 110 than the bent portion in the third embodiment is.

Both sides 141 of the flexible substrate 140 are bonded to surfaces of the display panel 120 and the driving circuit board 130 on the side closer to the cover bottom part 110. In this case, an end of a color filter panel portion 123 on the side closer to the driving circuit board 130 extends longer toward the driving circuit board 130 than a thin film transistor portion 121, and one side of the flexible substrate 140 is bonded to a lower surface of an extended portion of the color filter panel portion 123. A display drive element 143 is mounted on an inner surface of the flexible substrate 140. Therefore, the flexible substrate 140 may be shielded from the outside and protected from the outside by the driving circuit board 130.

In addition, a drive controller 132 is mounted on one surface (lower surface) of the driving circuit board 130 on the side closer to the cover bottom part 110. In this case, the driving circuit board 130 is supported on a support portion 153 of a panel guide part 150.

Communication holes 115 may be formed in the cover bottom part 110 to communicate with the heat dissipation holes 155. The communication holes 115 may also be formed in a portion of the cover bottom part 110 that does not correspond to the heat dissipation holes 155. Of course, the communication holes 115 may not be formed in the cover bottom part 110 and the cover bottom part 110 may be blocked. Therefore, the heat generated from the driving circuit board 130 and the drive controller 132 may be dissipated by the heat dissipation holes 155 or the heat dissipation holes 155 and the communication holes 115.

A panel guide part 150 may further include a heat dissipation pad 160 installed to cover the heat dissipation holes 155. The heat dissipation pad 160 allows the heat to be discharged through the heat dissipation holes 155 and the communication holes 115 and prevents external foreign substances such as dust or moisture from penetrating the inside of the cover bottom part 110.

In addition, the accommodating chamber 151 of the panel guide part 150 is formed to be wider than the width of the accommodating chamber 151 of the first embodiment to accommodate the flexible substrate 140 that is horizontal or bent to be slightly inclined. In this case, the side and bottom surfaces of the accommodating chamber 151 are supported by the cover bottom part 110. In addition, the support portion 153 supporting the display panel 120 may be formed to be longer than the support portion 153 supporting the driving circuit board 130.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A display device comprising:
a cover bottom part;
a display panel installed on the cover bottom part;
a driving circuit board disposed on one side of the display panel;
at least one flexible substrate bonded to the display panel and the driving circuit board to be bent toward an inner side of the driving circuit board; and
a panel guide part in which an accommodating chamber is formed so that a bent portion of the at least one flexible substrate is accommodated inside the driving circuit board.

2. The display device of claim 1, wherein the display panel is a curved display panel.

3. The display device of claim 2, wherein the display panel and the driving circuit board are disposed on the same curved surface.

4. The display device of claim 3, wherein the display panel and the driving circuit board are formed with the same curvature.

5. The display device of claim 2, wherein the bent portion of the at least one flexible substrate is disposed between the driving circuit board and the display panel.

6. The display device of claim 5, wherein the bent portion of the at least one flexible substrate is bent toward an outside of the driving circuit board.

7. The display device of claim 2, wherein both sides of the at least one flexible substrate are bonded to surfaces of the display panel and the driving circuit board on a side closer to the cover bottom part.

8. The display device of claim 2, wherein both sides of the at least one flexible substrate are bonded to surfaces of the display panel and the driving circuit board on a side opposite to the cover bottom part.

9. The display device of claim 1, wherein at least one heat dissipation hole is formed in the panel guide part to dissipate heat from the accommodating chamber.

10. The display device of claim 9, wherein a communication hole is formed in the cover bottom part to communicate with the heat dissipation hole.

11. The display device of claim 9, wherein the panel guide part further includes a heat dissipation pad installed to cover the heat dissipation hole.

12. The display device of claim 1, wherein a support portion is formed on the panel guide part to support the display panel and the driving circuit board.

\* \* \* \* \*